US006646282B1

(12) United States Patent
Chen

(10) Patent No.: US 6,646,282 B1
(45) Date of Patent: Nov. 11, 2003

(54) FIELD EMISSION DISPLAY DEVICE

(75) Inventor: Ga-Lane Chen, Fremont, CA (US)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/194,564

(22) Filed: Jul. 12, 2002

(51) Int. Cl.$^7$ .......................... H01L 29/06; H01L 31/20

(52) U.S. Cl. ........................... 257/10; 257/11; 313/309; 313/336; 313/495

(58) Field of Search .............................. 257/10, 11, 59; 313/399, 104, 293, 309, 311, 336, 351, 495; 315/39.57, 39.63

(56) References Cited

U.S. PATENT DOCUMENTS 5,663,608 A * 9/1997 Jones et al. ................. 313/309
5,729,087 A * 3/1998 Chien ......................... 313/495
6,455,989 B1 * 9/2002 Nakada et al. .............. 313/309

* cited by examiner

*Primary Examiner*—Minh Loan Tran
*Assistant Examiner*—Tan Tran
(74) *Attorney, Agent, or Firm*—Wei Te Chung

(57) ABSTRACT

A field emission display device (1) includes a cathode plate (20), a resistive buffer (30) in contact with the cathode plate, a plurality of electron emitters (40) formed on the buffer, and an anode plate (50) spaced from the electron emitters. Each electron emitter includes a rod-shaped first part (401) and a conical second part (402). The buffer and first parts are made from silicon oxide. The combined buffer and first parts has a gradient distribution of electrical resistivity such that highest electrical resistivity is nearest the cathode plate and lowest electrical resistivity is nearest the anode plate. The second parts are made from niobium. When emitting voltage is applied between the cathode and anode plates, electrons emitted from the electron emitters traverse an interspace region and are received by the anode plate. Because of the gradient distribution of electrical resistivity, only a very low emitting voltage is needed.

16 Claims, 3 Drawing Sheets

FIELD EMISSION DISPLAY DEVICE

BACKGROUND OF THE INVENTION

1. Field of the Invention

The present invention relates to a field emission display (FED) device, and more particularly to an FED device using a nano-scale electron emitter having low power consumption.

2. Description of Prior Art

In recent years, flat panel display devices have been developed and widely used in electronic applications such as personal computers. One popular kind of flat panel display device is an active matrix liquid crystal display (LCD) that provides high resolution. However, the LCD has many inherent limitations that render it unsuitable for a number of applications. For instance, LCDs have numerous manufacturing shortcomings. These include a slow deposition process inherent in coating a glass panel with amorphous silicon, high manufacturing complexity and low yield of units having satisfactory quality. In addition, LCDs require a fluorescent backlight. The backlight draws high power, yet most of the light generated is not viewed and simply wasted. Furthermore, an LCD image is difficult to see under bright light conditions and at wide viewing angles. Moreover, since the response time of an LCD is dependent upon the response time of a liquid crystal to an applied electrical field, the response time of the LCD is correspondingly slow. A typical response time of an LCD is in the range from 25 ms to 75 ms. Such difficulties limit the use of LCDs in many applications such as High-Definition TV (HDTV) and large displays. Plasma display panel (PDP) technology is more suitable for HDTV and large displays. However, a PDP consumes a lot of electrical power. Further, the PDP device itself generates too much heat.

Other flat panel display devices have been developed in recent years to improve upon LCDs and PDPs. One such flat panel display device, a field emission display (FED) device, overcomes some of the limitations and provides significant advantages over conventional LCDs and PDPs. For example, FED devices have higher contrast ratios, wider viewing angles, higher maximum brightness, lower power consumption shorter response time and broader operating temperature ranges when compared to conventional thin film transistor liquid crystal displays (TFT-LCDs) and PDPs.

One of the most important differences between an FED and an LCD is that, unlike the LCD, the FED produces its own light source utilizing colored phosphors. The FED does not require complicated, power-consuming backlights and filters. Almost all light generated by an FED is viewed by a user. Furthermore, the FED does not require large arrays of thin film transistors. Thus, the costly light source and low yield problems of active matrix LCDs are eliminated.

In an FED device, electrons are extracted from tips of a cathode by applying a voltage to the tips. The electrons impinge on phosphors on the back of a transparent cover plate and thereby produce an image. The emission current, and thus the display brightness, is highly dependent on the work function of an emitting material at the field emission source of the cathode. To achieve high efficiency for an FED device, a suitable emitting material must be employed.

FIG. 3 is a schematic side plan view of a conventional FED device 11. The FED device 11 is formed by depositing a resistive layer 12 on a glass substrate 14. The resistive layer 12 typically comprises an amorphous silicon base film. An insulating layer 16 comprising a dielectric material such as $SiO_2$ is formed on the resistive layer 12 and a metallic gate layer 18 are then deposited on the insulating layer 16. The insulating layer 16 and the metallic gate layer 18 are etched to provide a plurality of cavities (not labeled). Metal microtips 21 are respectively formed in the cavities. A cathode structure 22 is covered by the resistive layer 12. The resistive layer 12 underlies the insulating layer 16; nevertheless the resistive layer 12 is still somewhat conductive. It is important to be able to control electrical resistivity of the resistive layer 12 such that it is not overly resistive but still can act as an effective resistor to prevent excessive current flow if one of the microtips 21 shorts to the metallic gate layer 18.

It is difficult to precisely fabricate the extremely small microtips 21 for the field emission source. In addition, it is necessary to maintain the inside of the electron tube at a very high vacuum of about $10^{-7}$ Torr, in order to ensure continued accurate operation of the microtips 21. The very high vacuum required greatly increases manufacturing costs. Furthermore, a typical FED device needs a high voltage applied between the cathode and the anode, commonly in excess of 1000 volts.

SUMMARY OF THE INVENTION

In view of the above-described drawbacks, an object of the present invention is to provide a field emission display (FED) device which has low power consumption.

Another object of the present invention is to provide an FED device which has accurate and reliable electron emission.

In order to achieve the objects set above, an FED device in accordance with a preferred embodiment of the present invention comprises a cathode plate, a resistive buffer in contact with the cathode plate, a plurality of electron emitters formed on the resistive buffer and an anode plate spaced from the electron emitters thereby defining an interspace region therebetween. Each of the electron emitters substantially comprises a rod-shaped first part adjacent the buffer, and a conical second part distal from the buffer. The buffer and the first parts are made from silicon oxide ($SiO_x$), in which x can be controlled according to the required stoichiometry. This ensures that the combined buffer and first parts has a gradient distribution of electrical resistivity such that highest electrical resistivity is nearest the cathode plate and lowest electrical resistivity is nearest the anode plate. The second parts are respectively formed on the first parts, and are made from niobium. When emitting voltage is applied between the cathode and anode plates, electrons emitted from the electron emitters traverse the interspace region and are received by the anode plate. Because of the gradient distribution of electrical resistivity, only a very low emitting voltage needs to be applied.

In an alternative embodiment, the combined buffer and first parts can incorporate more than one gradient distribution of electrical resistivity.

Other objects, advantages and novel features of the present invention will become more apparent from the following detailed description when taken in conjunction with the accompanying drawings, in which:

DETAILED DESCRIPTION OF PREFERRED EMBODIMENTS OF THE INVENTION

Figure 1:
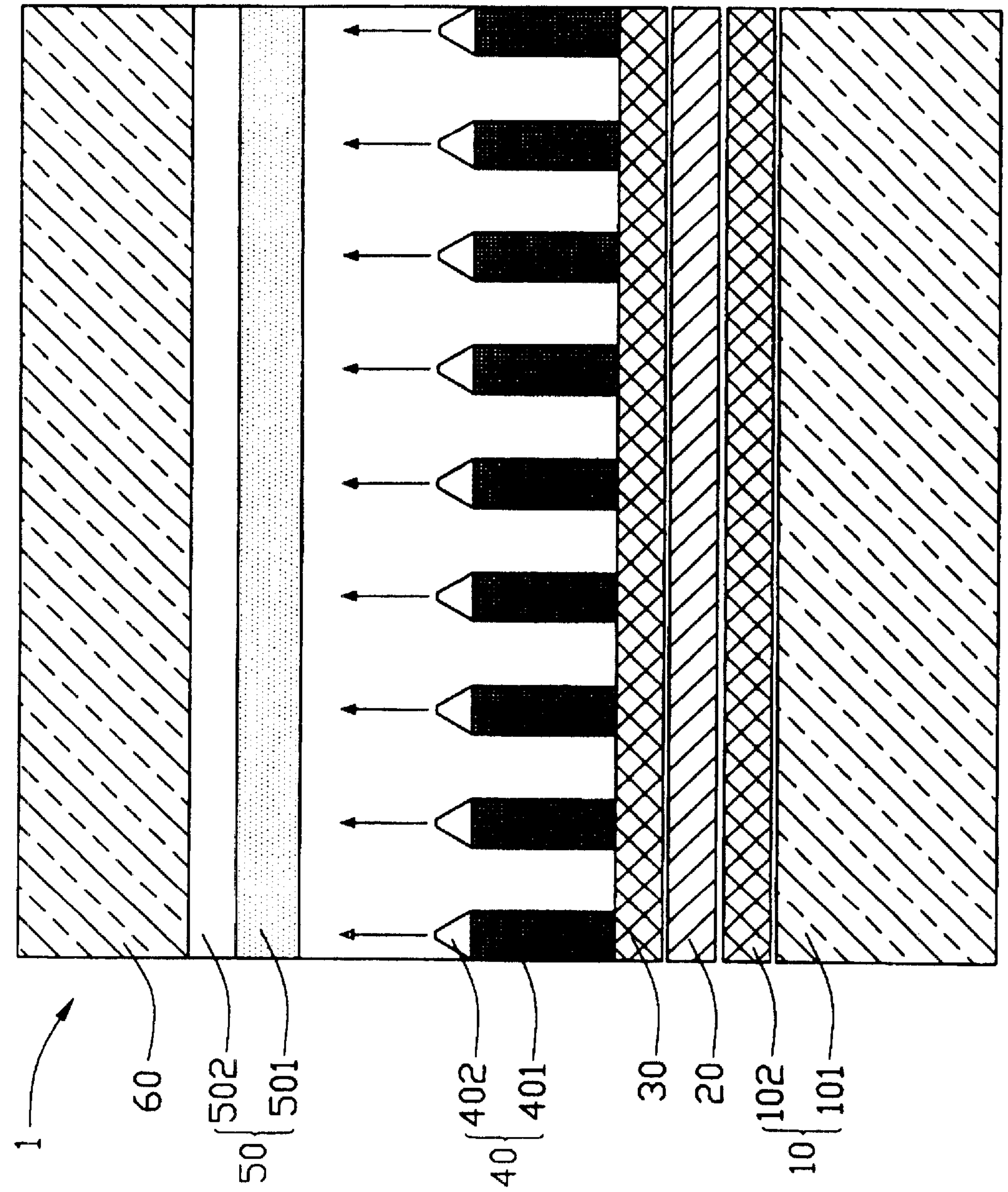
FIG. 1 is a schematic, cross-sectional view of a field emission display (FED) device in accordance with a preferred embodiment of the present invention.

Referring to FIG. 1, a field emission display device 1 in accordance with a preferred embodiment of the present invention comprises a first substrate 10, a cathode plate 20 made from electrically conductive material formed on the first substrate 10, a resistive buffer 30 in contact with the cathode plate 20, a plurality of electron emitters 40 formed on the resistive buffer 30, an anode plate 50 spaced from the electron emitters 40 thereby defining an interspace (not labeled) region between the electron emitters 40 and the anode plate 50, and a second substrate 60.

The first substrate 10 comprises a glass plate 101 and a silicon thin film 102. The silicon thin film 102 is formed on the glass plate 101 for providing effective contact between the glass plate 101 and the cathode plate 20.

Figure 2:
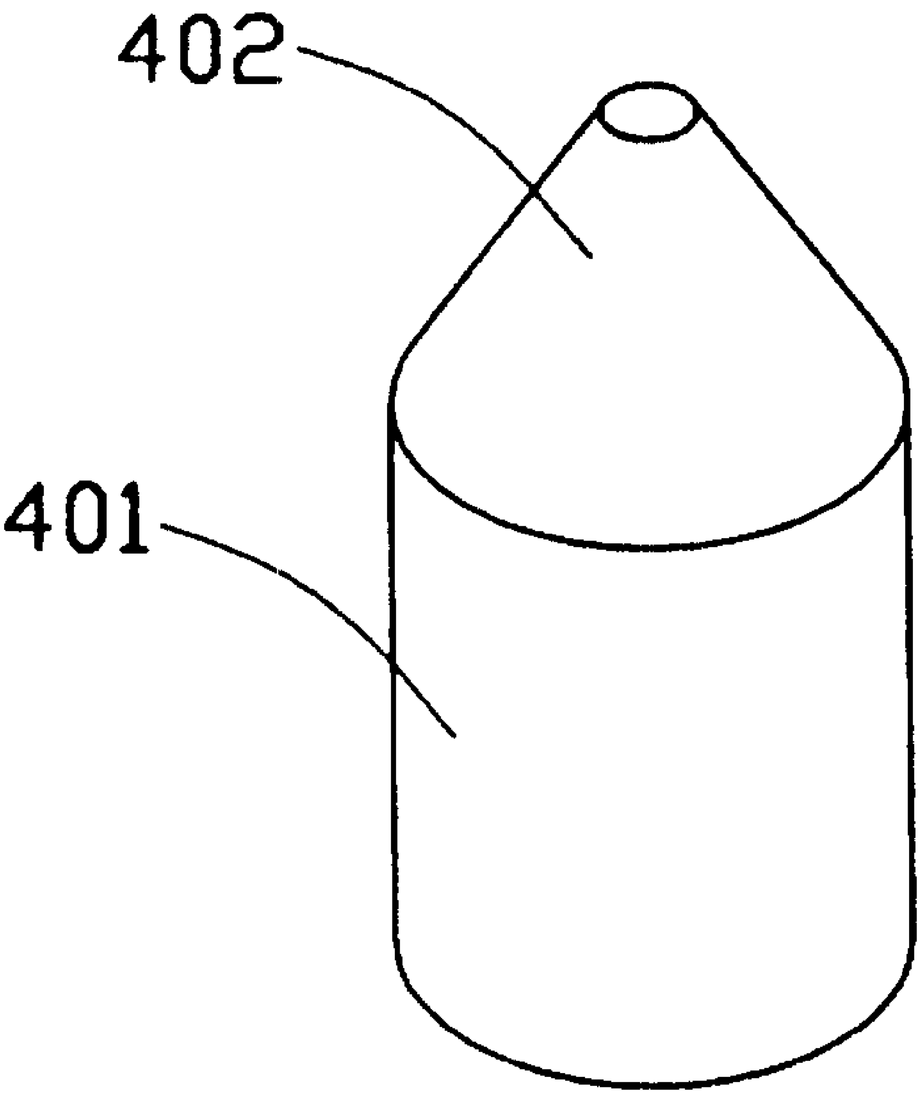
FIG. 2 is an enlarged, perspective view of part of an electron emitter of the FED device in accordance with the present invention.
Figure 3:
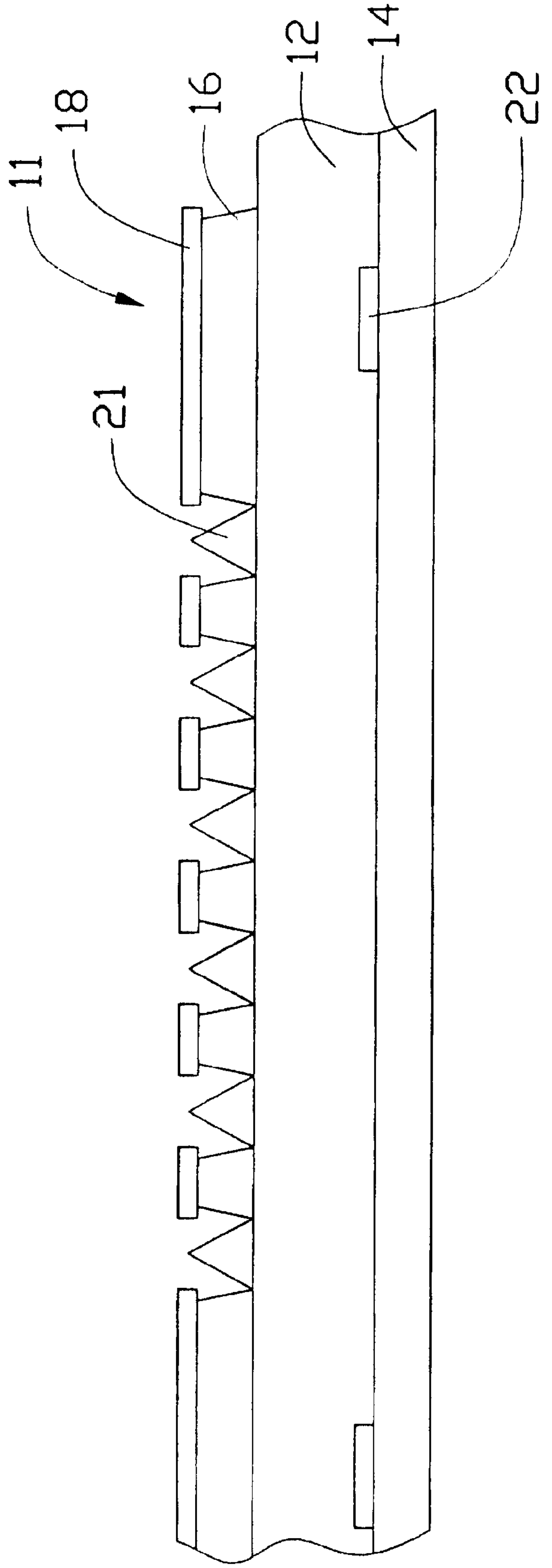
FIG. 3 (PRIOR ART)
FIG. 3 is a schematic, side plan view of a conventional FED device employing metallic microtips.

Referring also to FIGS. 1 and 2, each of the electron emitters 40 substantially comprises a rod-shaped first part 401 adjacent the buffer 30, and a conical second part 402 distal from the buffer 30. The buffer 30 and the first parts 401 are made from silicon oxide ($SiO_x$), in which x can be controlled according to the required stoichiometry. In the preferred embodiment, x is controlled to ensure that the combined buffer 30 and first parts 401 has a gradient distribution of electrical resistivity such that highest electrical resistivity is nearest the cathode plate 20 and lowest electrical resistivity is nearest the anode plate 50. The second parts 402 are respectively formed on the first parts 401, and are made from niobium (Nb).

In the preferred embodiment, each first part 401 has a microstructure comprising a nano-rod with a diameter in the range from 5 to 50 nanometers. The first part 401 has a length in the range from 0.2 to 2.0 micrometers. Each second part 402 has a microstructure comprising a circular top face (not labeled) at a distal end thereof. A diameter of the top face is in the range from 0.3 to 2.0 nanometers. In the preferred embodiment, the resistive buffer 30 and the electron emitters 40 can be preformed together by chemical vapor deposition (CVD), plasma-enhanced chemical vapor deposition (PECVD), or by other suitable chemical-physical deposition methods such as reactive sputtering, ion-beam sputtering, dual ion beam sputtering, and other suitable glow discharge methods. The first and second parts 401, 402 can then be formed by e-beam etching or other suitable methods.

In an alternative embodiment of the present invention, the combined buffer 30 and first parts 401 can incorporate more than one gradient distribution of electrical resistivity.

The anode plate 50 is formed on the second substrate 60, and comprises a transparent electrode 502 coated with a phosphor layer 501. The transparent electrode 502 allows light to pass therethrough. The transparent electrode 502 may comprise, for example, indium tin oxide (ITO). The phosphor layer 501 luminesces upon receiving electrons emitted by the second parts 402 of the electron emitters 40. The second substrate 60 is preferably made from glass.

In operation of the FED device 1, an emitting voltage is applied between the cathode plate 20 and the anode plate 50. This causes electrons to emit from the second parts 402 of the electron emitters 40. The electrons traverse the interspace region from the second parts 402 of the electron emitters 40 to the anode plate 50, and are received by phosphor layer 501. The phosphor layer 501 luminesces, and a display is thus produced.

Because the combined buffer 30 and first parts 401 has a gradient distribution of electrical resistivity, only a low emitting voltage needs to be applied between the cathode plate 20 and the anode plate 50 to cause electrons to emit from the electron emitters 40.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A field emission display device comprising:

a cathode plate;

a resistive buffer in contact with the cathode plate;

a plurality of electron emitters formed on the resistive buffer, each of the electron emitters comprising a first part adjoining the resistive buffer, and a second part adjoining the first part, the resistive buffer and first parts being made of silicon oxide, the second parts being made of niobium; and an anode plate spaced from the electron emitters thereby defining an interspace region therebetween;

wherein the combined resistive buffer and first parts comprises at least one gradient distribution of electrical resistivity such that highest electrical resistivity is nearest the cathode plate and lowest electrical resistivity is nearest the anode plate.

2. The field emission display device as described in claim 1, wherein each of the first parts has a microstructure comprising a nano-rod with a diameter in the range from 5 to 50 nanometers.

3. The field emission display device as described in claim 2, wherein the nano-rod has a length in the range from 0.2 to 2.0 micrometers.

4. The field emission display device as described in claim 1, wherein each of the second parts has a substantially conical microstructure.

5. The field emission display device as described in claim 4, wherein the substantially conical microstructure comprises a top face distal from the resistive buffer, a diameter of the top face being in the range from 0.3 to 2.0 nanometers.

6. The field emission display device as described in claim 1, wherein the anode plate comprises a transparent electrode coated with phosphor.

7. The field emission display device as described in claim 6, wherein the transparent electrode comprises indium tin oxide.

8. The field emission display device as described in claim 1, wherein the cathode plate is formed on a first substrate comprising glass, and the anode plate is formed on a second substrate comprising glass.

9. The field emission display device as described in claim 8, wherein the first substrate further comprises a silicon thin film formed thereon for providing effective contact between the glass of the first substrate and the cathode plate.

10. A field emission display device comprising:

a cathode plate;

a resistive buffer in contact with the cathode plate;

a plurality of electron emitters formed on the resistive buffer, each of the electron emitters substantially comprising a first part adjoining the resistive buffer, and a second part adjoining the first part, the buffer and the first parts being made of silicon oxide; and an anode plate spaced from the electron emitters thereby defining an interspace region therebetween;

wherein the resistive buffer comprises at least one gradient distribution of electrical resistivity such that highest electrical resistivity is nearest the cathode plate and lowest electrical resistivity is nearest the anode plate.

11. The field emission display device as described in claim 10, wherein each of the first parts has a substantially rod-shaped microstructure with a diameter in the range from 5 to 50 nanometers.

12. The field emission display device as described in claim 11, wherein the substantially rod-shaped microstructure has a length in the range from 0.2 to 2.0 micrometers.

13. The field emission display device as described in claim 10, wherein the second parts are made of niobium.

14. The field emission display device as described in claim 13, wherein each of the second parts has a substantially conical microstructure.

15. The field emission display device as described in claim 14, wherein the substantially conical microstructure comprises an top face distal from the resistive buffer, a diameter of the top face being in the range from 0.3 to 2.0 nanometers.

16. A field emission display device comprising:

a cathode plate;

an anode plate spaced from the cathode plate;

a buffer in contact with the cathode plate; and a plurality of electron emitters formed on and extending from the cathode plate toward the anode plate, each of the electron emitters being a nano-tube comprising a rod-like first part proximate the cathode plate, and a conical second part adjoining the first parts while spaced from the anode plate;

wherein both the buffer and the first part are made of silicon oxide having high electrical resistivity thereof, while the second parts is made of only niobium having low electrical resistivity thereof.

* * * * *